(12) United States Patent
Coban et al.

(10) Patent No.: US 8,854,130 B2
(45) Date of Patent: Oct. 7, 2014

(54) DC-COUPLED PEAK DETECTOR

(75) Inventors: Abdulkarim Coban, Austin, TX (US);
Wenhuan Yu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 75 days.

(21) Appl. No.: 13/532,575

(22) Filed: Jun. 25, 2012

(65) Prior Publication Data
US 2013/0342274 A1  Dec. 26, 2013

(51) Int. Cl.
 *H03G 3/20* (2006.01)
(52) U.S. Cl.
 USPC .......................................... 330/140
(58) Field of Classification Search
 USPC ................ 330/129, 140, 279, 133, 278
 See application file for complete search history.

(56) References Cited

U.S. PATENT DOCUMENTS

| | | | |
|---|---|---|---|
| 4,613,769 A | 9/1986 | Gross et al. | |
| 6,897,712 B2 * | 5/2005 | Ficken et al. | 327/537 |
| 7,013,117 B2 | 3/2006 | Darabi | |
| 7,426,376 B2 * | 9/2008 | Srinivasan et al. | 455/252.1 |
| 7,486,114 B2 | 2/2009 | Chen et al. | |
| 7,944,246 B2 * | 5/2011 | Uchiki | 330/140 |
| 2005/0264359 A1 * | 12/2005 | Juang et al. | 330/279 |
| 2012/0034895 A1 * | 2/2012 | Xuechu et al. | 455/341 |

* cited by examiner

*Primary Examiner* — Khanh V Nguyen
(74) *Attorney, Agent, or Firm* — Meyertons, Hood, Kivlin, Kowert & Goetzel, P.C.

(57) ABSTRACT

Techniques are disclosed relating to peak detection. In one embodiment, an apparatus is disclosed that includes an amplifier configured to amplify a signal. The apparatus further includes a peak detector DC coupled to an output of the amplifier. The peak detector includes a first comparator stage configured to perform subtraction of a threshold signal from the amplified signal. The peak detector further includes a second comparator stage is configured to amplify a differential output signal of the first comparator stage indicative of a result of the subtraction. In some embodiments, the amplifier and peak detector are included within automatic gain control system in a path for an in-phase or quadrature channel of the receiver chain.

21 Claims, 10 Drawing Sheets

DC-COUPLED PEAK DETECTOR

BACKGROUND

1. Technical Field

This disclosure relates generally to signal processing, and, more specifically, to circuits configured to perform peak power detection.

2. Description of the Related Art

A receiver chain typically performs a variety of operations to process a received signal. Such operations may include filtering the signal, demodulating it, sampling it, etc. In order to perform some of these operations, various circuits in the receiver chain may require that the signal have a signal strength within a particular range. Often, however, this signal is too weak by the time it arrives at the receiver. To account for this, the receiver chain may attempt to amplify the signal before processing it further.

In many instances, receiver chains employ a feedback loop in which an incoming signal passes through an amplifier and then a peak detector to measure the peak power of the signal. If the signal strength is too high or too low, the circuit adjusts the gain of the amplifier accordingly. This form of feedback loop is commonly referred to as an automatic gain control (AGC) system.

SUMMARY

The present disclosure describes embodiments of structures and methods relating to peak detection.

In one embodiment, an apparatus is disclosed. The apparatus includes an amplifier configured to amplify a signal. The apparatus further includes a peak detector direct-current (DC) coupled to an output of the amplifier. The peak detector includes a first comparator stage configured to perform subtraction of a threshold signal from the amplified signal. The peak detector further includes a second comparator stage configured to amplify a differential output signal of the first comparator stage indicative of a result of the subtraction.

In another embodiment, a method is disclosed. The method includes receiving an amplified signal at a peak detector that is DC coupled to an output of an amplifier. The method further includes subtracting, at a first comparator stage of the peak detector, a threshold signal from the amplified signal. The method further includes amplifying. at a second comparator stage of the peak detector, a differential output signal of the first comparator stage indicative of a result of the subtracting.

In still another embodiment, an apparatus is disclosed. The apparatus includes an AGC circuit including an amplifier and a peak detector. The peak detector is DC coupled to an output of the amplifier. The peak detector is configured to use a first comparator stage and a second comparator stage to compare the amplified signal with a threshold signal.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

DETAILED DESCRIPTION

The present disclosure describes embodiments of a peak detector configured to measure the strength of an input signal relative to a threshold. Such a circuit may be included within an automatic gain control (AGC) system along with a variable-gain amplifier circuit to facilitate gain adjustment of the amplifier. As will be described below, in various embodiments, the peak detector is direct current (DC) coupled to an output of the amplifier. The phrase "DC coupled" has its ordinary and accepted meaning in the art and refers to the lack of a capacitor coupled in series along a path between the output of one circuit and the input of another circuit; in contrast, alternating current (AC) coupled refers to the presence of a capacitor coupled in series between two circuits. In many instances, the DC-coupled peak detector is able to process lower frequency input signals than an AC-coupled peak detector as the capacitor used in AC coupling functions as a high-pass filter that blinds the detector from low-frequency input signals. However, a benefit of AC coupling is the filtering of low-frequency noises and DC offsets. Since the DC-coupled peak detector is not afforded the benefit of this filtering, the peak detector may employ various techniques described below to compensate for low-frequency interference.

It is noted that, while certain embodiments are described herein within the context of automatic gain control, and more specifically within the context of receiver chains, such embodiments may also be applicable to other applications in some instances.

Figure 1A:
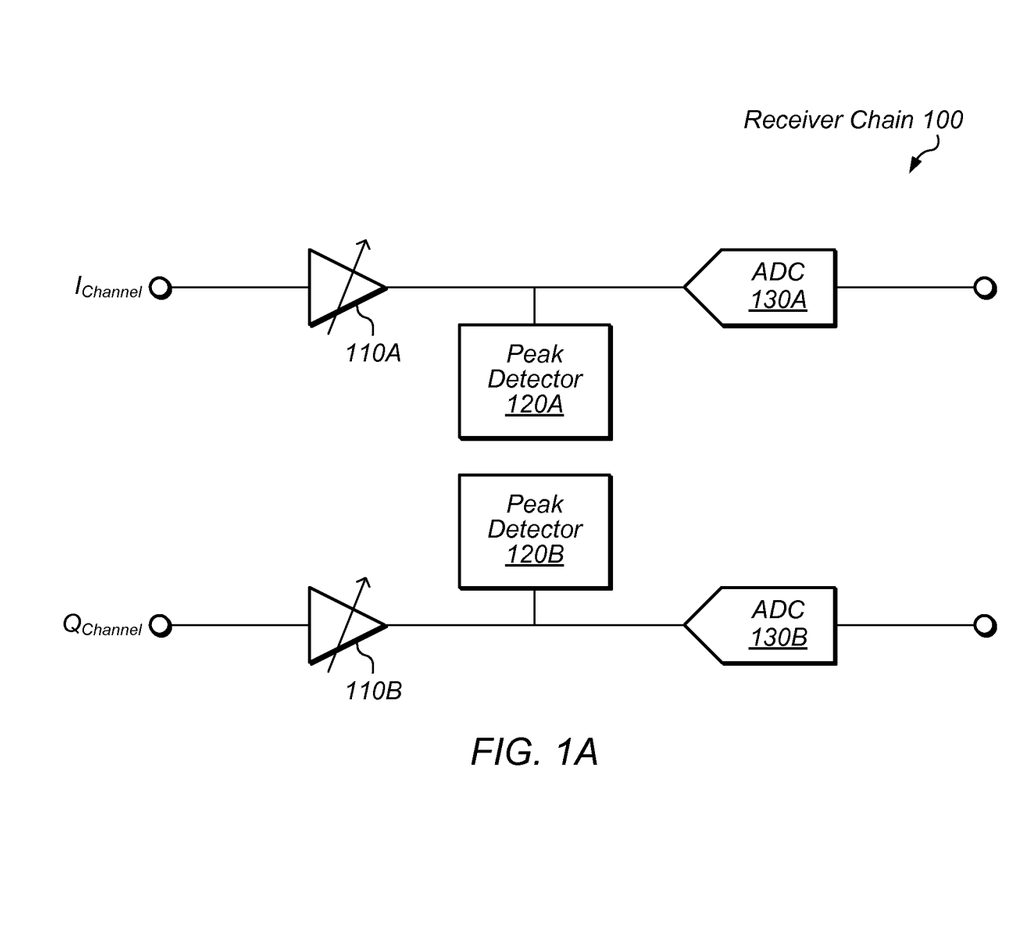
FIG. 1A is a block diagram illustrating one embodiment of a portion of a receiver chain.

Turning now to FIG. 1A, a block diagram of a portion of a receiver chain 100 is depicted. Receiver chain 100 is one embodiment of a circuit that includes peak detectors such as described above. Receiver chain 100 may be used in various applications such as television receivers, cellular phones, modems, network devices, satellite radios, etc. In some embodiments, receiver chain 100 may be used in wireless devices; in other embodiments, receiver chain 100 may be used in wired devices. In short, receiver chain 100 may be used in any suitable application.

In the illustrated embodiment, receiver chain 100 supports complex signal processing. Accordingly, receiver chain 100 has an in-phase channel (I channel) path including amplifier 110A, peak detector 120A, and analog-to-digital converter (ADC) 130A. Receiver chain 100 also has a quadrature channel (Q channel) path that includes amplifier 110B, peak detector 120B, and ADC 130B. In various embodiments, receiver chain 100 includes additional components such as splitters, mixers, filters, etc. to further process an incoming signal. In one embodiment, receiver chain 100 may include a single path (rather than separate I and Q channel paths).

Amplifiers 110, in one embodiment, are configured to amplify I and Q components to maximize the signal-to-noise ratio (SNR) of ADCs 130. In various embodiments, amplifiers are programmable-gain amplifiers (PGAs) that are adjusted by control logic (not shown) based on the power indications of peak detectors 120. (This control logic may be implemented via a microcontroller, processor, application-specific integrated circuit (ASIC), etc.) In one embodiment, amplifiers 110 operate on an intermediate-frequency (IF) signal that has been shifted down from a radio frequency (RF). However, in other embodiments, amplifiers 110 may operate on RF or baseband signals.

Peak detectors 120, in one embodiment, are configured to compare the peak output of amplifiers 110 with a respective threshold signal to determine whether the amplified signals fall within the desired range for ADCs 130. If the amplified signals fall outside of this range, the gains of amplifiers 110 can be increased or decreased accordingly. In some embodiments, peak detectors 120 are configured such that one of the detectors (e.g., detector 120A) compares its amplified signal with a threshold signal corresponding to an upper boundary of the ADC range, while the other detector (e.g., detector 120B) compares its amplified signal with a threshold signal corresponding to a lower boundary of the range. The gains of amplifiers 110 may then be adjusted based on the power indications output from both detectors 120. In some embodiments, peak detectors 120 may be configured to operate in an initial acquisition mode (in which a more stringent range is initially used until the signal is properly adjusted) and a subsequent tracking mode (in which a less stringer range is later used). A graph illustrating one embodiment of automatic gain control with these two modes is discussed below with respect to FIG. 1B.

In various embodiments, peak detectors 120A and 120B are DC coupled to the output of amplifiers 110A and 110B, respectively. As noted above, coupling peak detectors 120 in this manner permits them to process lower frequency signals (as well as low frequency blockers such as down converted close-in blockers of a low-IF signal chain) that are normally filtered out by the capacitors used in AC coupling. As will be discussed with respect to FIG. 2, in one embodiment, the inputs of peak detectors 120 may be coupled to respective scaling shifting units configured to process the amplified signals so that those signals fall within an operating range of detectors 120. Detectors 120 may also be coupled to a threshold generation unit configured to generate threshold signals used in the comparisons performed by detectors 120. As will be discussed with respect to FIG. 3, in one embodiment, peak detectors 120 include a first comparator stage configured to perform subtraction of a threshold signal from the amplified signal as well as amplification of the result and a second comparator stage configured to amplify a differential output signal of the first comparator stage indicative of a result of the subtraction. The output of the second stage may then be integrated and latched to create the power indications for peak detectors 120.

ADCs 130, in one embodiment, are configured to convert the amplified signals from the analog domain to the digital domain. (Circuits located before ADCs 130 in receiver chain 100 may thus be described as being part of the analog portion of receiver chain 100; circuits located after ADCs 130 may be described as being part of the digital portion of chain 100.) ADCs 130 may be any suitable type of ADC such as an integrating ADC, sigma delta ADC, etc.

Figure 1B:
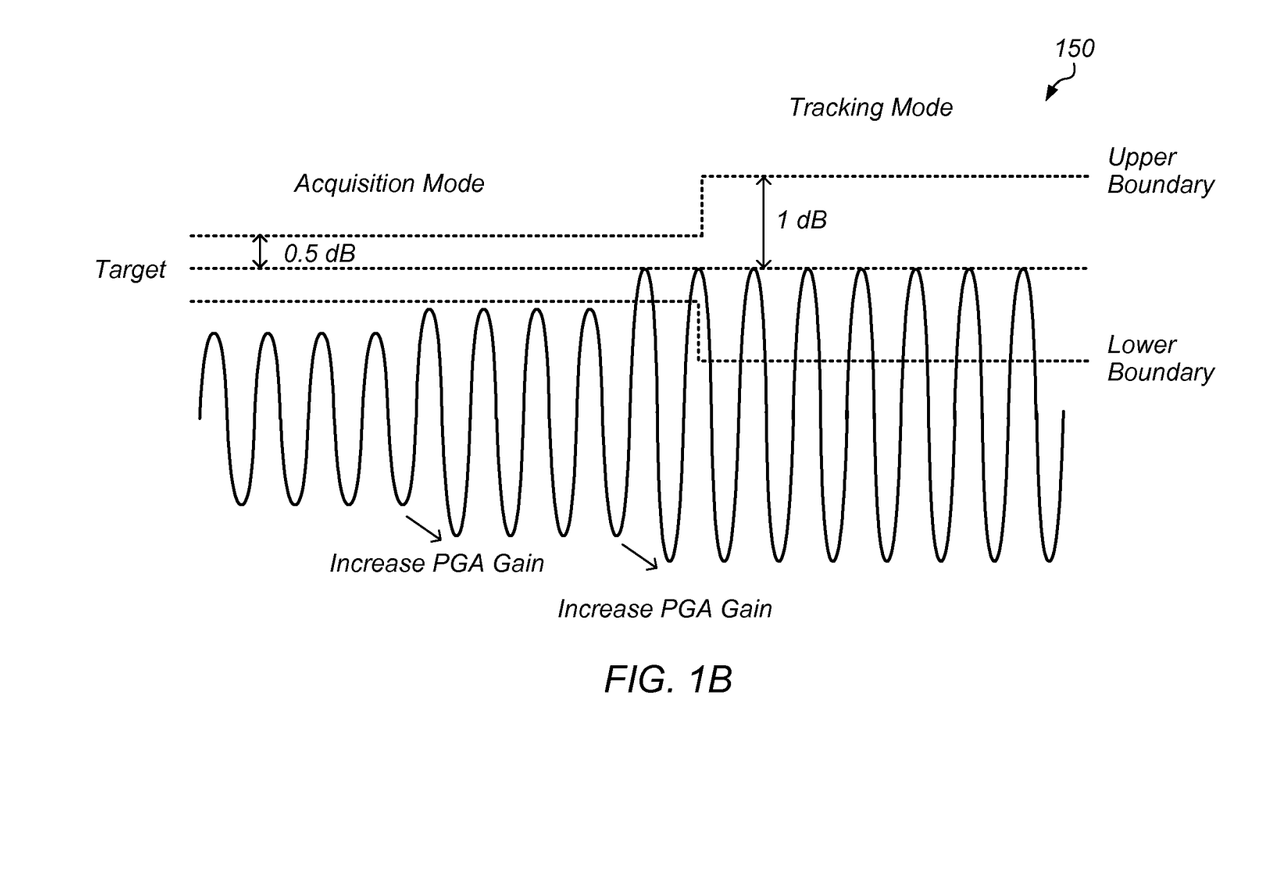
FIG. 1B is a graph illustrating one embodiment of automatic gain control.

Turning now to FIG. 1B, a graph 150 illustrating one embodiment of automatic gain control is depicted. As discussed above, in some embodiments, peak detectors 120 may operate in an initial acquisition mode to acquire an incoming signal (i.e., ensure that the peak power is within an initial range of ADCs 130) and then operate in a subsequent tracking mode to maintain the incoming signal within the ADC range.

Graph 150 begins with peak detectors 120 operating in acquisition mode in which the gains of amplifiers 110 are adjusted relative to an initial range (e.g., +/−0.5 dB of a target, in the illustrated embodiment). As shown, the gain of amplifiers is initially increased after peak detectors 120 indicate that the peak of the incoming signal is below the lower boundary of the acquisition range. The gain is then increased when it is determined that the peak is still below the lower boundary.

At this point, the amplified signal is within the desired acquisition range, so peak detectors 120, in one embodiment, transition to the subsequent tracking mode in which the signal is adjusted based on a wider range (e.g., +/−1 dB of the target, in the illustrated embodiment). If the peak of the signal falls outside this range, the amplifier gain may be adjusted accordingly. If, after an extensive period, receiver chain 100 is unable to reacquire the signal, in some embodiments, peak detectors 120 may return to the acquisition mode until the signal is reacquired.

Figure 2:
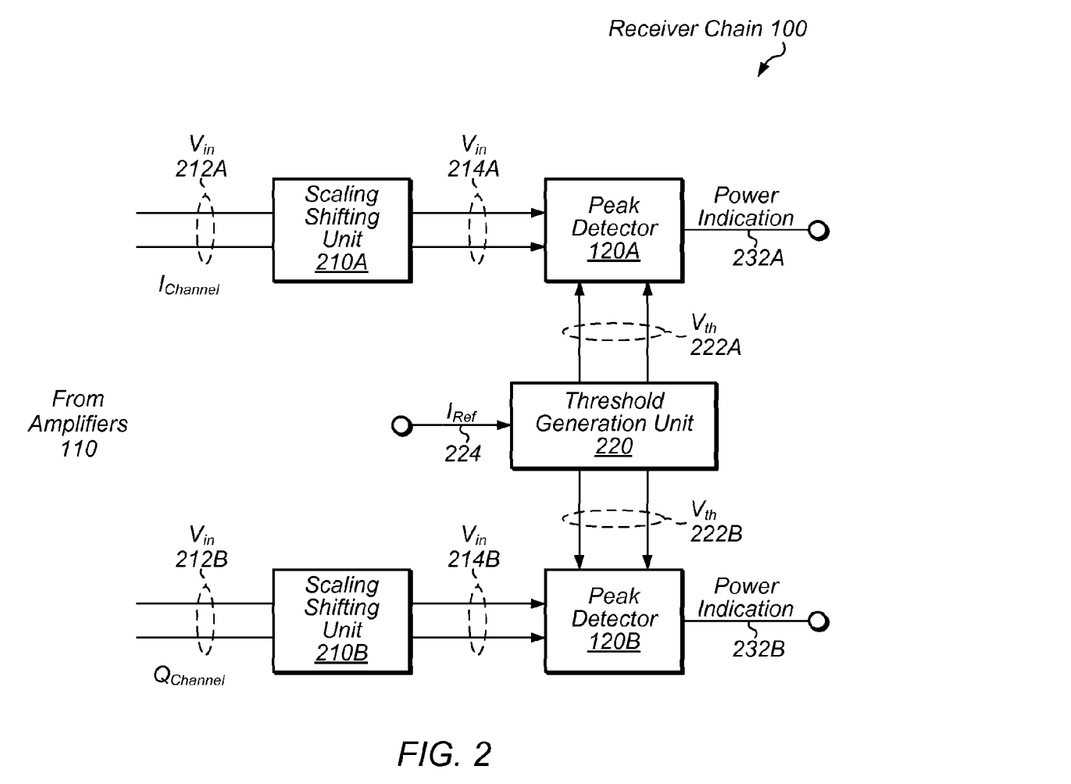
FIG. 2 is a block diagram illustrating one embodiment of circuits within the receiver chain portion.

Turning now to FIG. 2, a block diagram of circuits within a portion of receiver chain 100 is depicted. In the illustrated embodiment, instead of coupling peak detector inputs directly to the PGA outputs, peak detectors 120 are coupled to respective scaling shifting units 210 and a threshold generation unit 220. In such an embodiment, inputs of scaling shifting units 210 are coupled to the outputs of amplifiers 110. As noted above, these units may be used to facilitate operation of peak detectors 120.

Scaling shifting units 210, in one embodiment, are configured to scale or shift the amplified I and Q channel signals (shown as $V_{in}$ 212A and 212B, respectively) if the peaks of the signals are outside of the operating ranges of peak detectors 120. (It is noted that while, in the illustrated embodiment, input signals 212 are shown as differential input signals, in other embodiments, signals 212 may be non-differential signals.) As will be discussed below with respect to FIG. 4, in some embodiments, peak detectors 120 include one or more differential pairs of transistors. In some instances, the input signals 212 and the threshold signals 222 are so high that the differential pairs do not work properly because of limited input common mode range. To prevent this, in some embodiments, a scaling shifting unit 210 is configured to scale the input signal by an amount (e.g., 0.5× in one embodiment) when the voltage of a signal 212 is within a higher range (e.g., −9~8 dBm in one embodiment) and to shift the signal 212 down by an amount (e.g., 0.27 V in one embodiment) without scaling when the voltage of the signal 212 is within a lower range (e.g., −14~−9 dBm in one embodiment). In scaling mode input signal is attenuated and therefore sensitivity to DC offset voltages is higher. Having a shifting mode for low level signals in which input signal is shifted to fall into peak detector input common mode range without attenuation relaxes DC offset requirements of peak detector cores. By scaling or shifting input signals 212, in various embodiments, scaling shifting units 210 are able to ensure peak detectors 120 works properly. One embodiment of a scaling shifting unit 210 is discussed below with respect FIG. 6.

Threshold generation unit 220, in one embodiment, is configured to generate the threshold voltages $V_{th}$ 222 used by peak detectors in comparisons with input signals $V_{in}$ 214. In some embodiments, threshold generation unit 220 is implemented as a resistor ladder configured to generate multiple reference voltages by selecting various ones of the resistors in the ladder using a corresponding set of switches. In the illustrated embodiment, threshold generation unit 220 generates the voltages based on a supplied reference current $I_{Ref}$ 224. In some embodiments, threshold generation unit 220 is configured to provide a threshold voltage (e.g., $V_{th}$ 222A) corresponding to an upper boundary of a range to one of the peak detectors 120 and to provide a threshold voltage (e.g., $V_{th}$ 222B) corresponding to a lower boundary of the range to the other peak detector 120.

Figure 3:
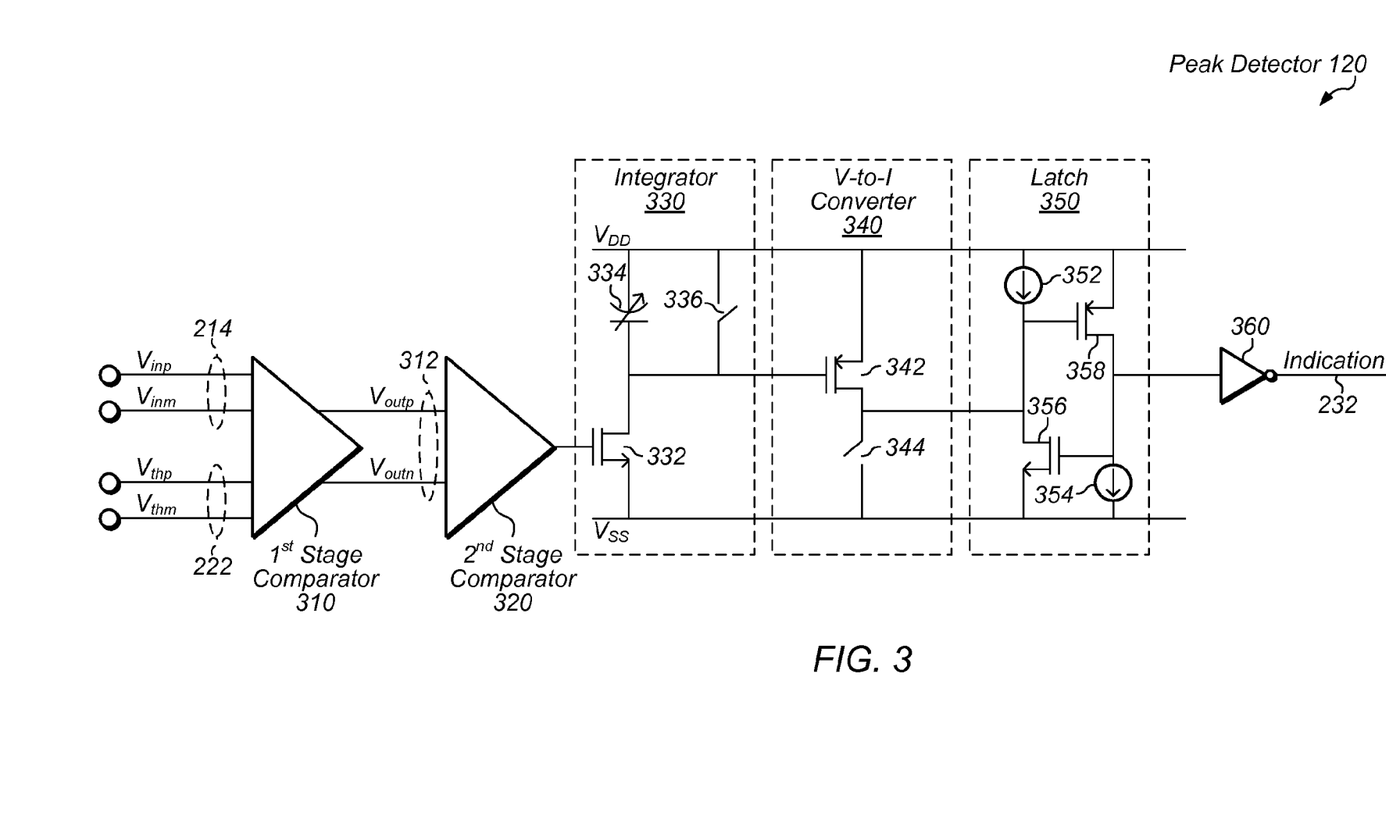
FIG. 3 is a block diagram illustrating one embodiment of a DC-coupled peak detector within the receiver chain.

Turning now to FIG. 3, a block diagram of peak detector 120 is depicted. In the illustrated embodiment, peak detector 120 includes a first comparator 310 at a first-stage, a second comparator 320 at a second stage, an integrator 330, a voltage-to-current (V-to-I) converter 340, a latch 350, and an inverter 360.

First-stage comparator 310, in one embodiment, is configured to perform subtraction of a threshold signal 222 from an amplified signal 214 and produce a differential output signal 312 indicative of the subtraction resultant. Comparator 310 may also provide some amplification of the subtraction resultant. In various embodiments, comparator 310 is DC coupled to the output of an amplifier 110. Comparator 310 is discussed in further detail with respect to FIG. 4.

Second stage comparator 320, in one embodiment, is configured to amplify the differential output signal 312. In the illustrated embodiment, comparator 320 is configured as a differential-to-single-end amplifier—thus producing a non-differential (or single ended) output signal for integrator 330.

Integrator 330, in one embodiment, is configured to integrate the output of comparator 320. In some instances, integrator 330 may be used to eliminate potential false positive indications. In the illustrated embodiment, integrator 330 includes transistor 332, variable capacitor 334, and reset switch 336. Integrator 330 is further coupled to voltage source rails $V_{DD}$ and $V_{SS}$.

Voltage-to-current converter 340, in one embodiment, is configured to convert the voltage output from integrator 330 to a current usable by latch 350. In the illustrated embodiment, converter 340 includes a transistor 342 and a reset switch 344.

Latch 350, in one embodiment, is configured to latch the output of converter 340 once the voltage from integrator 330 reaches a threshold voltage. In the illustrated embodiment, latch 350 includes a current source 352, current source 354, transistor 356, and transistor 358.

Inverter 360, in one embodiment, is configured to invert the output of latch 350 to produce a power indication 232 indicative of whether $V_{in}$ 214 is greater or lesser than $V_{th}$ 222. In some embodiments, peak detector 120 may not include an inventor 360 or may have more than one inverter stages.

Figure 4:
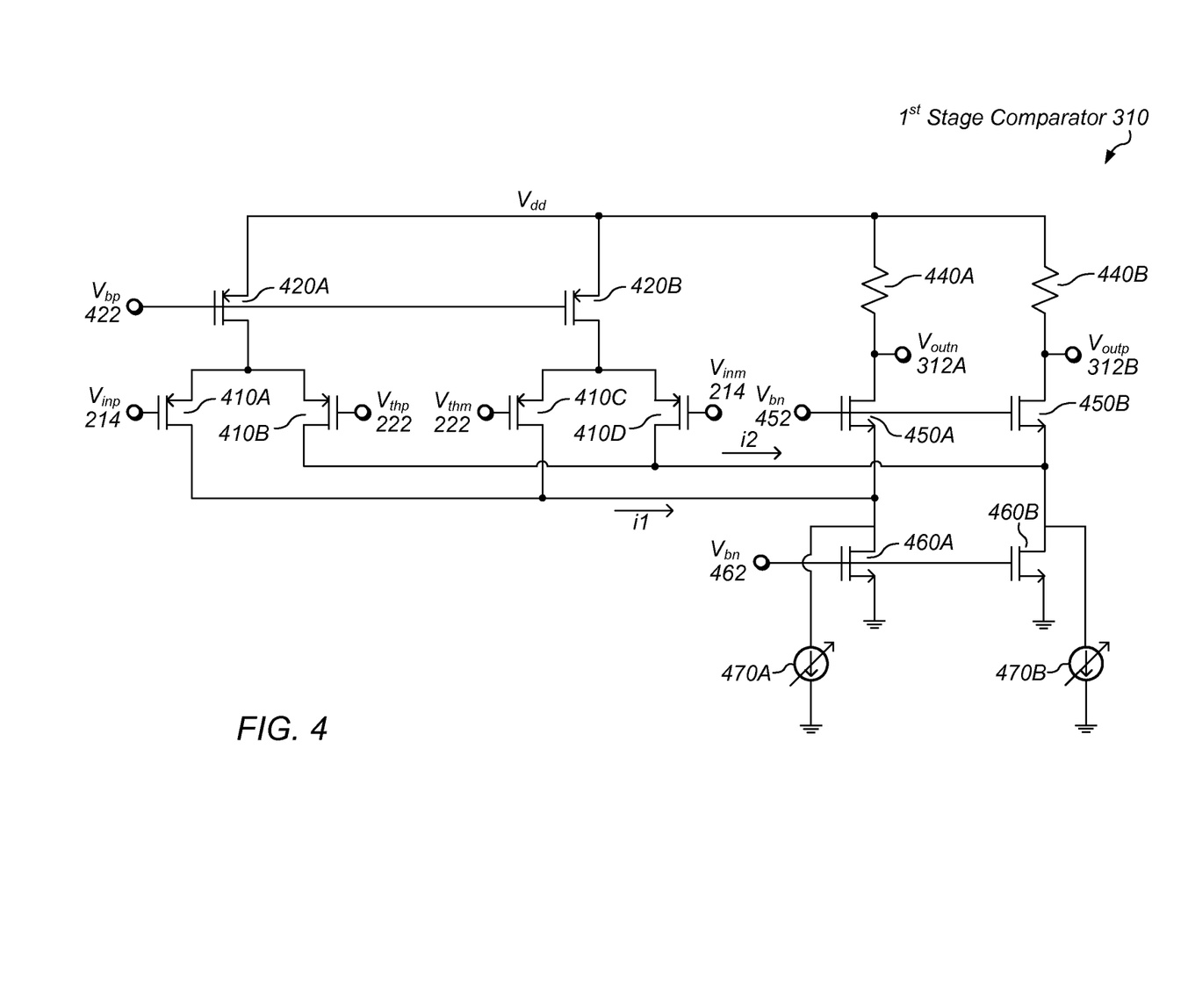
FIG. 4 is a block diagram illustrating one embodiment of a first-stage comparator in the peak detector.

Turning now to FIG. 4, a block diagram of first-stage comparator 310 is depicted. In the illustrated embodiment, comparator 310 includes a first differential pair of transistors 410A and 410B and a second differential pair of transistors 410C and 410D. As shown, the positive portions of input differential signal 214 and threshold differential signal 222 are applied to the gates of transistors 410A and 410B, respectively. The negative portions of input differential signal 214 and threshold differential signal 222 are applied to the gates of transistors 410C and 410D, respectively. The sources of the first differential pair and the sources of the second differential pair are coupled respectively to transistors 420A and 420B (which are configured to receive a base voltage 422). The drains of transistors 410A and 410C and the drains of transistors 410B and 410D are coupled respectively to transistors 460A and 460B (which are configured to receive a base voltage 462). Transistors 460A and 460B are coupled respectively to offset current sources 470A and 470B as well as respectively to transistors 450A and 450B. Transistors 450A and 450B are coupled respectively to output nodes 312A and 312B, which, in turn, are coupled respectively to resistors 440A and 440B. (In some embodiments, transistors 410 and 420 are P-type metal-oxide-semiconductor field-effect transistors (PMOSFETs), and transistors 450 and 460 are N-type metal-oxide-semiconductor field-effect transistors (NMOSFETs).)

In the illustrated embodiment, when the peak of input signal 214 is much smaller than threshold signal 222 (i.e., $V_{inp} < V_{thp} - \sqrt{2}V_{ov}$, $V_{inm} > V_{thm} + \sqrt{2}V_{ov}$, where $V_{ov}$ is an overdrive of the differential transistor pairs), transistor 410A and transistor 410C turn on, while transistor 410B and transistor 410D turn off. Thus $V_{outn}$ goes high and $V_{outp}$ low. When the peak of the input signal 214 is close to threshold signal 222, transistors 410 act as two differential pairs satisfying the following equation:

$$i_1 - i_2 \approx -g_m(V_{inp} + V_{thm}) - [-g_m(V_{inm} + V_{thp})] = -g_m[(V_{inp} - V_{inm}) - (V_{thp} - V_{thm})] \quad (1)$$

As indicated by equation (1), the threshold signal 222 is subtracted from the input signal 214 producing an output voltage $V_{out}$ 312 based on currents $i_1$ and $i_2$ and resistors 440A and 440B—output voltage 312 being indicative of a comparison between input signal 214 and threshold signal 222. When the peak of input signal 214 is much larger than threshold signal 222, transistors 410A and 410C turn off while transistors 410B and 410D turn on. Thus, $V_{outn}$ goes low, and $V_{outp}$ goes high.

In the illustrated embodiment, for the differential pairs to work properly, the voltage of threshold signal 222 cannot exceed $V_{dd} - V_{sdsat} - V_{SG}$ (where $V_{sdsat}$ is the saturation voltage of transistor 420A and $V_{SG}$ is the source-to-gate voltage of transistor 410A). To enable the comparison of input signals 212 with threshold signals 222 above this voltage, scaling shifting units 210 are used, in one embodiment, to scale input signals 212 when their voltages are within a first higher range, and to shift input signals 212 down (without scaling) when their voltages are within a second lower range. As noted above, one embodiment of scaling shifting unit 210 is discussed below with respect to FIG. 6.

Offset current sources 470, in one embodiment, are variable current sources configured to reduce the presence of offsets (e.g., DC offsets due to transistor mismatches in the differential pairs) by applying currents to the drains of transistors 460. The offset currents may be adjusted in a complementary fashion (i.e., while one is being increased the other one decreased by the same amount.) If left unchecked, the presence of these offsets may reduce the accuracy of detectors 120. Still further, the presence of offsets may result in a mismatching of peak detectors 120 relative to one another. In embodiments in which detectors 120 each measure a respective boundary of a range, the presence of offsets may result in the tested upper boundary actually being lower than the tested lower boundary—thus creating the situation in which it is impossible to find valid gain settings for amplifiers 110. In various embodiments, the amounts of currents applied by current sources 470 may be determined as part of a calibration scheme for receiver chain 100. One embodiment of circuitry used in this calibration scheme is discussed next with respect to FIG. 5.

Figure 5:
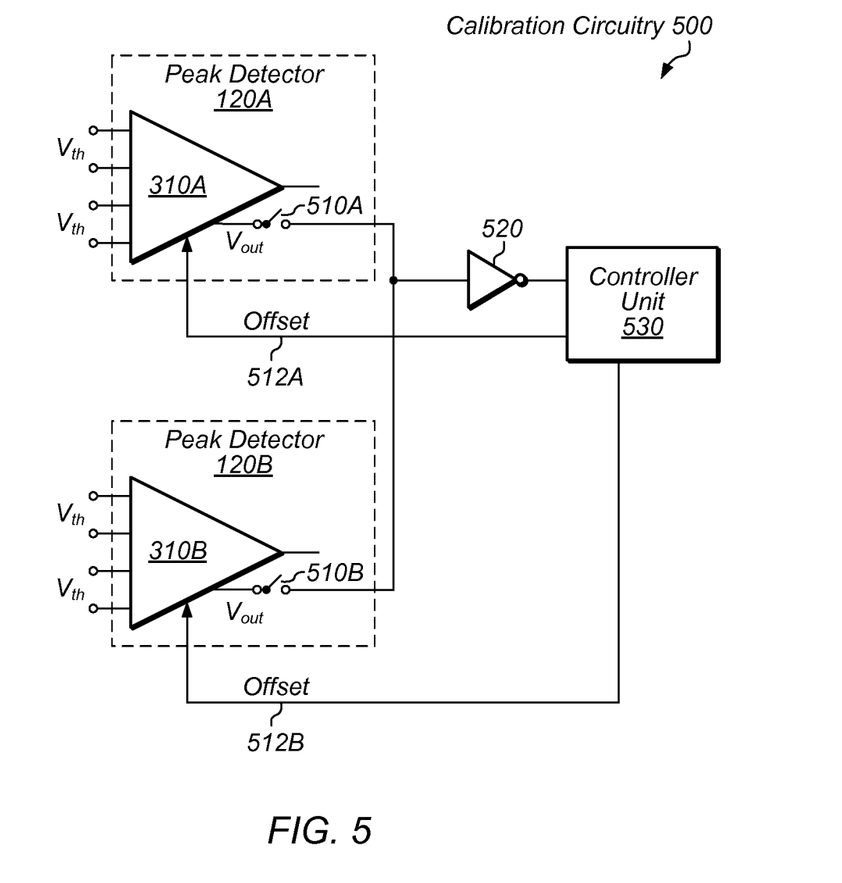
FIG. 5 is a block diagram illustrating one embodiment of circuitry for calibrating a pair of first-stage comparators.

Turning now to FIG. 5, a block diagram of circuitry 500 for calibrating a pair of first-stage comparators 310 is depicted. In the illustrating embodiment, circuitry 500 includes switches 510, inverter 520, and controller unit 530.

In one embodiment, calibration for a given comparator 310 may begin with the same threshold voltage being applied by generation unit 220 to both terminals of the comparator 310. The output signal of second stage comparator (320) $V_{out}$ is then routed via switch 510 to inventor 520. In one embodiment, controller unit 530 sweeps through a range of offsets 512 (e.g., starting a minimum value and moving to a maximum value) applying different currents via currents sources 470. Upon detecting a change in the output of inventor 520, controller unit 530 may record the last offset 512 and conclude the sweep. Controller unit 530 may then apply that offset for that comparator 310 during normal operation. Calibration for the other comparator 310 may be performed in a similar manner.

Figure 6:
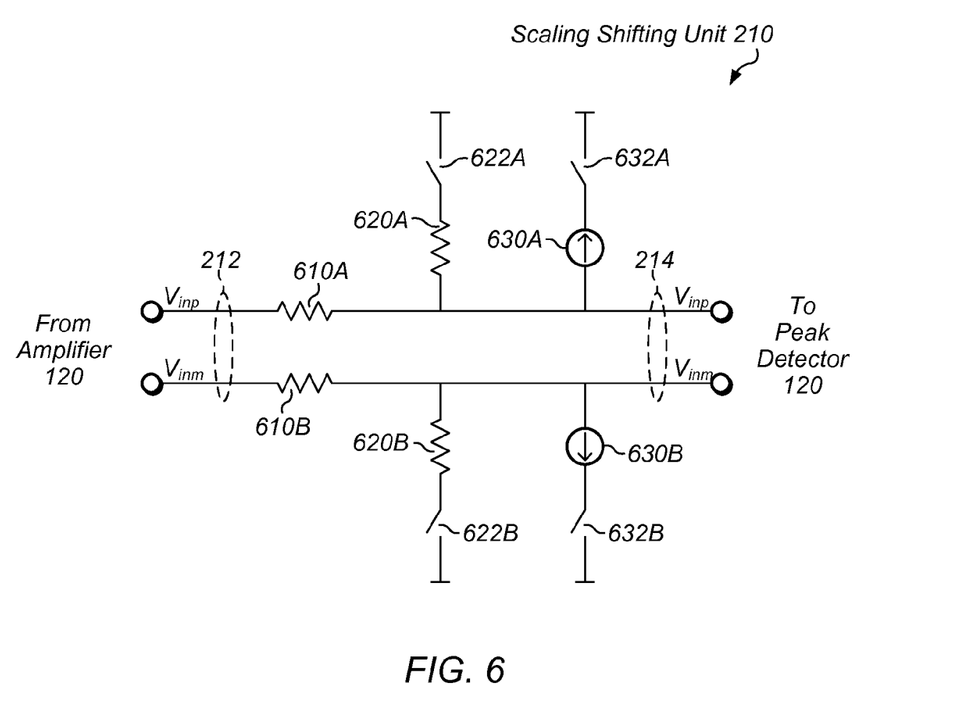
FIG. 6 is a block diagram illustrating one embodiment of a scaling shifting unit.

Turning now to FIG. 6, a block diagram of scaling shifting unit 210 is depicted. As discussed above, in some embodiments, scaling shifting unit 210 may be used to scale input signal 212 when the peak voltage is within a first range (e.g., −9~8 dBm in one embodiment) or shift input signal 212 when the peak voltage is within a second range (e.g., −14~−9 dBm in one embodiment). In the illustrated embodiment, scaling shifting unit 210 includes resistors 610 and 620, switches 622 and 632, and current sources 630. To scale an input signal 212 (e.g., by 0.5×) during a scaling mode, scaling shifting unit 210 may select resistors 610 and 620 (functioning as a voltage divider) via switches 622. Scaling shifting unit 210 may alternatively shift the voltage of input signal 212 during a shifting mode by selecting current sources 630 via switches 632. In various embodiments, shifting input signal 212 results in a higher accuracy for peak detector 120 than scaling signal 214.

Figure 7:
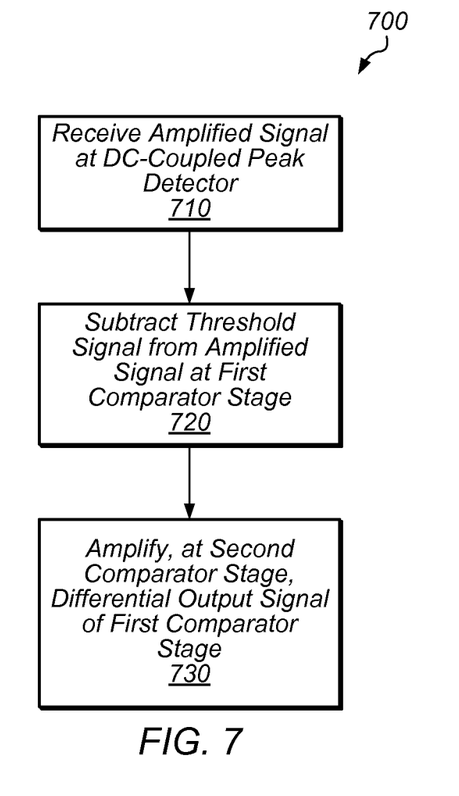
FIG. 7 is a flow diagram illustrating one embodiment of a method performed by a peak detector.

Turning now to FIG. 7, a flow diagram of a method 700 is depicted. Method 700 is one embodiment of a method that may be performed by an AGC system including a peak detector such as detector 120. In one embodiment, method 700 is performed after the peak detector has been calibrated for offsets.

In step 710, a peak detector receives an amplified signal from an amplifier. In some embodiments, the peak detector may be within an I channel path (e.g., detector 120A) or a Q channel path (e.g., detector 120B) of a receiver chain. In one embodiment, the peak detector may be measuring the signal's strength relative to an upper boundary of a particular range while another peak detector is measuring the input signal's strength relative to a lower boundary of the particular range. In some embodiments, step 710 may include determining whether to scale or shift (e.g., using scaling shifting unit 210) the amplified signal responsive to the amplified signal being outside an operating range of the peak detector.

In step 720, a first comparator stage (e.g., comparator 310) of the peak detector subtracts a threshold signal (e.g., signal $V_{th}$ 222) from the amplified signal (e.g., signal $V_{in}$ 214). In some embodiments, step 720 may include applying the amplified signal as a differential signal to gates of a first transistor (e.g., transistor 410A) and a second transistor (e.g., transistor 410D) within the first comparator stage and applying the threshold signal as a differential signal to gates of a third transistor (e.g., transistor 410B) and a fourth transistor (e.g., transistor 410C) within the first comparator stage. In some embodiments, step 720 may further include applying a first offset current to a drain of a fifth transistor (e.g., transistor 460A) and a second offset current to a drain of a sixth transistor (e.g., transistor 460B).

In step 730, a second comparator stage (e.g. comparator 320) of the peak detector amplifies a differential output signal (e.g., signal $V_{out}$ 312) of the first comparator stage indicative of a result of the subtracting. In some embodiments, step 730 may further include integrating (e.g., at integrator 330) the output of the second stage and latching (e.g., at latch 350) the integrated output to create a power indication (e.g., indication 232).

Figure 8:
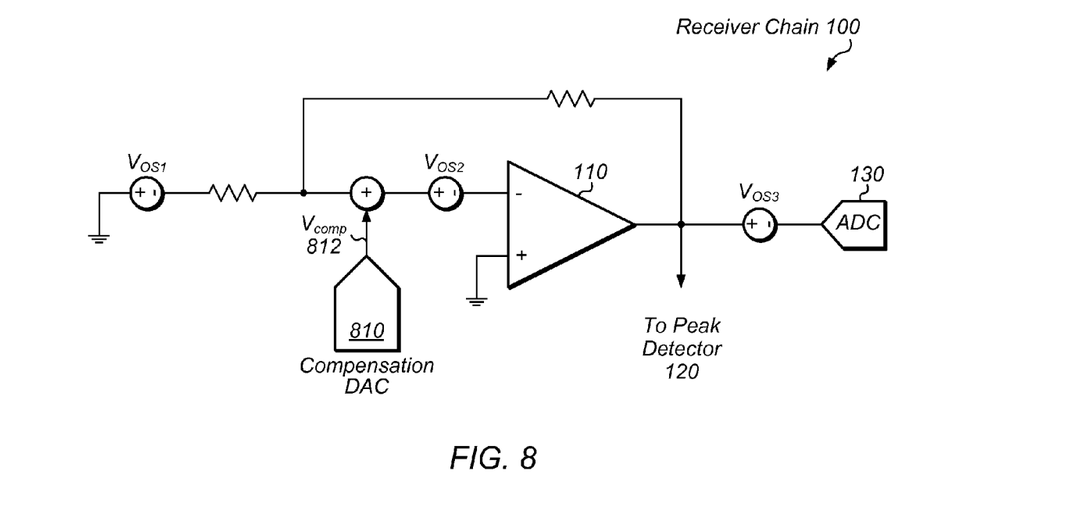
FIG. 8 is a block diagram illustrating one embodiment of a receiver chain including an offset compensation digital-to-analog converter (DAC).

Turning now to FIG. 8, one embodiment of receiver chain 100 that includes an offset compensation DAC 810 is depicted. (Although a single DAC 810 is shown for simplicity, in some embodiments, receiver chain 100 may include separate DACs 810 for I and Q channel paths.) As discussed above, the accuracy of peak detectors 120 may be affected by the presence of offsets. In some instances, these offsets may be caused by circuitry internal to peak detectors 120 (such as the mismatching of transistors 410 as noted above). In other instances, because peak detectors 120 are DC coupled to amplifiers 110 in various embodiments, their accuracies may be affected by offsets created by circuitry external to detectors 120. In the illustrated embodiment, these offsets include a mixer output DC offset voltage (shown as $V_{OS1}$), an amplifier input offset voltage (shown as $V_{OS2}$) for amplifier 110, and an ADC input offset voltage (shown as $V_{OS3}$) for ADC 130.

Compensation DAC 810, in one embodiment, is configured to apply an offset compensation signal 812 to an input of amplifier 110 to reduce the presence of these offsets (particularly at the input of peak detector 120). In some embodiments, the voltage adjustment $V_{comp}$ of signal 812 is determined according to a calibration scheme that includes shorting the input of the signal chain to be calibrated (in one example the PGA is preceded by a mixer whose effective input shorting is achieved by setting the mixer input to a high impedance) and measuring an offset for an analog portion of the receiver chain (shown in equation (2) as $V_{OS,OUT}$) for different gain values (G) of amplifier 110.

$$V_{OS,OUT}=V_{OS1}G+V_{OS2}(1+G)+V_{OS3}=(V_{OS1}+V_{OS2})G+(V_{OS2}+V_{OS3}) \quad (2)$$

The scheme further includes calculating a value X and a value Y based on the measured offsets such that $X=V_{OS1}+V_{OS2}$ and $Y=V_{OS2}+V_{OS3}$. $V_{OS,OUT}$ can be written in terms of X and Y as $$V_{OS,OUT}=XG+Y \quad (3)$$

The values of X and Y are calculated by measuring $V_{OS,OUT}$ at ADC output for two different gain settings $G_1$ and $G_2$. Assume that $V_{OS,OUT1}$ and $V_{OS,OUT2}$ are the corresponding output offset levels for gains $G_1$ and $G_2$, respectively—i.e., $$V_{OS,OUT1}=XG_1+Y \quad (4a)$$

$$V_{OS,OUT2}=XG_2+Y \quad (4b).$$

From (4a) and (4b) one can show $$X = \frac{V_{OS,OUT1} - V_{OS,OUT2}}{G_1 - G_2} \quad (5a)$$

$$Y = \frac{G_1 V_{OS,OUT2} - G_2 V_{OS,OUT1}}{G_1 - G_2} \quad (5b)$$

A value Z may then be computed by shorting the input of ADC 130 and measuring offset $V_{OS3}$ such that $Z=V_{OS3}$.

Finally, $V_{comp}$ is determined according to the following equation:

$$V_{comp} = \frac{XG + Y - Z}{1 + G}. \quad (6)$$

In some instances, DAC 810 may not be able to produce the exact (i.e., ideal) value of $V_{comp}$ determined by this equation, so the value may be rounded to the nearest voltage producible by DAC 810 (referred to below as $V_{comp\_round}$). In one embodiment, this value may be the nearest producible value; in other embodiments, $V_{comp}$ may always be rounded up to next producible value (or down to the next value, in one embodiment). For example, in one embodiment, DAC 810 may be configured to produce a set of voltages separated by a step value of 1 mV (e.g., voltages of 6 mV, 7 mV, 8 mV, and so on). In this instance, if $V_{comp}$ is determined to be 6.7 mV, DAC 810 may apply a $V_{comp\_round}$ of 7 mV.

In some embodiments, the rounding error ($q = V_{comp\_round} - V_{comp}$) may be significant enough to cause a mismatch between I and Q channel peak detects 120 (which, as discussed above, can create a situation in which no appropriate gain values can be determined for amplifiers 110). To account for this, in one embodiment, receiver chain 100 calculates a rounding error for the I channel DAC 810 (shown below as q(I))—the rounding error being indicative of a difference between the offset compensation signal applied by the DAC 810 (e.g., $V_{comp\_round}$) and an ideal offset compensation signal to reduce an offset of the I channel path (e.g., $V_{comp}$). The receiver chain 100 further calculates a rounding error for the Q channel DAC 810 (shown below as q(Q)). In one embodiment, if the rounding errors differ by more than half a step value for the DACs 810 (i.e., |q(I)−q(Q)|>0.5 of step value), the signal 812 for one of the DACs 810 is adjusted by one step value such that the final |q(I)−q(Q)|<0.5 of step value. For example, suppose the step value of DACs 810 is 1 mV and the gain of amplifiers 110 is set to 10. In this instance, the rounding error has a uniform distribution from −0.5 mV to 0.5 mV. When the rounding error is amplified, this distribution increases to a range from −5.5 mV to 5.5 mV. The difference of the rounding errors between I and Q channels after amplification thus has the distribution from −11 mV to 11 mV. In some embodiments, this distribution may be problematic—particularly when receiver chain 100 is operating on small signals. Accordingly, signal 812 for one of the DACs 812 (i.e., the I-channel DAC 812 or the Q-channel DAC 812) may be adjusted by one step value to reduce the distribution back to −5.5 mV to 5.5 mV. In other words, if $V_{comp}$ for the I channel is determined to be 6.4 mV and $V_{comp}$ for the Q channel is determined to be 6.5 mV, those values are rounded to a $V_{comp\_round}$ of 6 mV and 7 mV, respectively, in one embodiment. The rounding errors for the I and Q channels become respectively −0.4 mV and 0.5 mV—thus deferring by more than half of step value or 0.5 mV. When amplified, these errors create a difference of 9.9 mV (i.e., |−4.4 mV-5.5 mV|) between the I and Q channels. If the I channel DAC 810 is adjusted to a $V_{comp\_round}$ of 7 mV, the difference instead becomes 1.1 mV (i.e., |6.6 mV-5.5 mV|).

Figure 9:
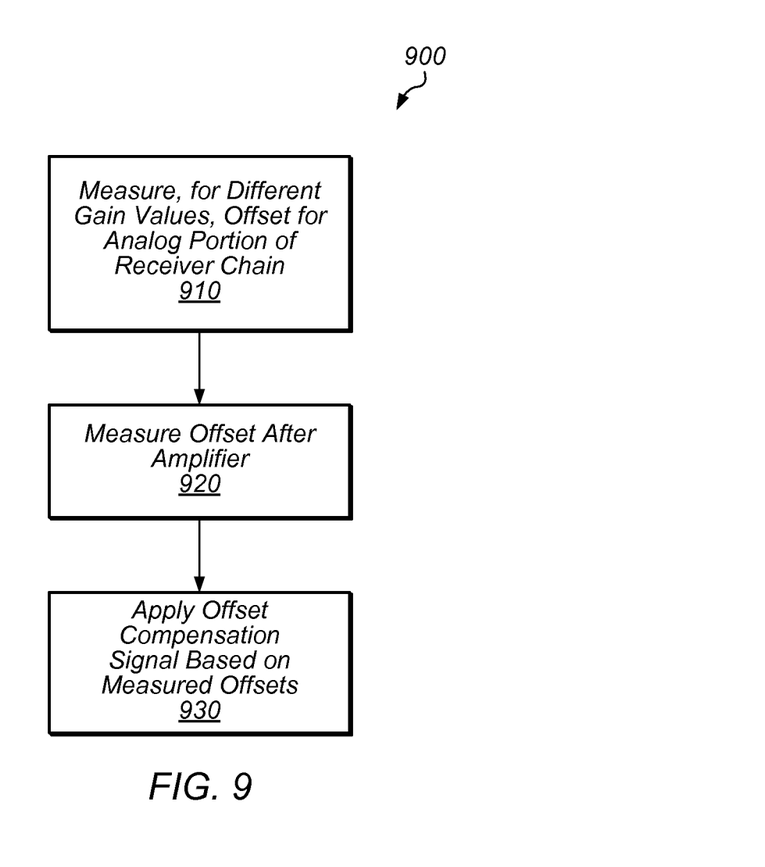
FIG. 9 is a flow diagram illustrating one embodiment of a method for calibrating an AGC circuit to compensate for offsets.

Turning now to FIG. 9, a flow diagram of a method 900 for calibrating an AGC circuit to compensate for various offsets is depicted. Method 900 is one embodiment of a method that may be performed by a receiver chain such as receiver chain 100.

In step 910, an offset for an analog portion of a receiver chain is measured for different gain settings of an amplifier (e.g., an amplifier 110). (In other words, an offset is computed (e.g., using equation (2) above) for a first gain setting, and the offset is computed again for a second gain setting.) In some embodiments, measuring this offset may include increasing an impedance of a mixer within the analog portion of the receiver chain.

In step 920, an offset (e.g., $V_{OS3}$) between the output of the amplifier and an ADC (e.g., an ADC 130) coupled to the output of the amplifier is measured. In some embodiments, measuring this offset may include shorting the input of the ADC.

In step 930, an offset compensation signal (e.g., signal 812) is applied based on the measured offsets in steps 910 and 920. In one embodiment, the adjustment voltage of this signal may be computed according to equation (6) above. In some embodiments, step 930 may further include 1) calculating a first rounding error indicative of a difference between the first offset compensation signal applied by a first DAC and an ideal offset compensation signal to reduce an offset of the in-phase channel path, and 2) calculating a second rounding error indicative of a difference between the second offset compensation signal applied by a second DAC and an ideal offset compensation signal to reduce an offset of the quadrature channel path. Step 930 may further include adjusting one of the first and second offset compensation signals in response to the first and second rounding errors differing by more than a threshold (e.g., half of a DAC step value).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   an amplifier configured to amplify a signal;
   a peak detector direct-current (DC) coupled to an output of the amplifier, wherein the peak detector includes:
      a first comparator stage configured to perform subtraction of a threshold signal from the amplified signal; and
      a second comparator stage configured to amplify a differential output signal of the first comparator stage indicative of a result of the subtraction; and
   a digital-to-analog converter (DAC) configured to apply an offset compensation signal to an input of the amplifier, wherein the offset compensation signal reduces an offset of a receiver chain that includes the amplifier and the peak detector.

2. The apparatus of claim 1, further comprising:
a receiver chain including in-phase and quadrature (I and Q) channel paths, wherein the I channel path includes the amplifier and the peak detector, wherein the Q channel path includes another amplifier and another peak detector.

3. The apparatus of claim 2, wherein a portion of the receiver chain is configured to operate on an input signal within a particular range, wherein a first of the peak detectors is configured to measure the input signal's power relative to an upper boundary of the particular range, and wherein a second of the peak detectors is configured to measure the input signal's power relative to a lower boundary of the particular range.

4. The apparatus of claim 1, wherein the amplified signal is a differential signal applied to gates of a first transistor and a second transistor within the first comparator stage, wherein the threshold signal is a differential signal applied to gates of a third transistor and a fourth transistor within the first comparator stage, wherein the first and third transistors form a differential pair, and wherein the second and fourth transistors form a differential pair.

5. The apparatus of claim 4, wherein the first and fourth transistors are coupled to a fifth transistor, wherein the second and third transistors are coupled to a sixth transistor, wherein the first comparator stage is configured to apply a first offset current to a drain of the fifth transistor and a second offset current to a drain of the sixth transistor, and wherein the first comparator stage is further configured to amplify a result of the subtraction.

6. The apparatus of claim 1, further comprising:
a circuit coupled between the amplifier and the peak detector, wherein the circuit is configured to scale the amplified signal in response to the amplified signal being within a first range.

7. The apparatus of claim 6, wherein the circuit is further configured to shift the amplified signal in response to the amplified signal being within a second range.

8. The apparatus of claim 1, wherein the amplifier is a programmable gain amplifier (PGA), wherein the apparatus is configured to:
operate in a first mode in which a gain of the PGA is adjusted based on an output of the peak detector indicating whether the amplified signal is within a boundary of a first range;
operate in a second mode in which the gain of the PGA is adjusted based on an output of the peak detector indicating whether the amplified signal is within a boundary of a second range, and wherein the first range is narrower than the second range.

9. The apparatus of claim 1, wherein the apparatus is configured to:
measure, for different gain values of the amplifier, an offset for an analog portion of the receiver chain; and
measure an offset between the output of the amplifier and an analog-to-digital converter (ADC) coupled to the output of the amplifier;
wherein the DAC is configured to apply the offset compensation signal based on the measured offsets.

10. A method, comprising:
receiving an amplified signal at a peak detector that is direct-current (DC) coupled to an output of an amplifier;
determining whether to scale or shift the amplified signal responsive to the amplified signal being outside an operating range of the peak detector;
subtracting, at a first comparator stage of the peak detector, a threshold signal from the amplified signal; and
amplifying, at a second comparator stage of the peak detector, a differential output signal of the first comparator stage indicative of a result of the subtracting.

11. The method of claim 10, wherein the amplified differential output signal is usable to produce an output of the peak detector; and
wherein the method further comprises adjusting a gain of the amplifier based on the output of the peak detector, and wherein the amplifier is an amplifier within an in-phase-channel path of a receiver chain or is an amplifier within a quadrature-channel path of the receiver chain.

12. The method of claim 10, further comprising:
calibrating a receiver chain that includes the amplifier and the peak detector, wherein the calibrating includes:
for different gain values of the amplifier, measuring an offset for an analog portion of the receiver chain; and
applying an offset compensation signal to an input of the amplifier.

13. The method of claim 12, wherein the measuring includes shorting of an input of the receiver chain.

14. An apparatus, comprising:
an automatic gain control (AGC) circuit including an amplifier and a peak detector, wherein the peak detector is direct-current (DC) coupled to an output of the amplifier, wherein the amplifier and the peak detector correspond to a path for an in-phase channel of the AGC circuit, and wherein the AGC circuit further includes a path for a quadrature channel; and
wherein the peak detector is configured to use a first comparator stage and a second comparator stage to compare an amplified signal from the amplifier with a threshold signal.

15. The apparatus of claim 14, further comprising:
a first digital-to-analog converter (DAC) configured to apply a first offset compensation signal to an input of the amplifier; and
a second digital-to-analog converter (DAC) configured to apply a second offset compensation signal to an input of an amplifier in the quadrature-channel path.

16. The apparatus of claim 15, wherein the apparatus is configured to:
calculate a first rounding error indicative of a difference between the first offset compensation signal applied by the first DAC and an ideal offset compensation signal to reduce an offset of the in-phase channel path;
calculate a second rounding error indicative of a difference between the second offset compensation signal applied by the second DAC and an ideal offset compensation signal to reduce an offset of the quadrature channel path; and
adjusting one of the first and second offset compensation signals in response to the first and second rounding errors differing by more than a threshold.

17. The apparatus of claim 14, wherein the first comparator stage is configured to perform subtraction of the threshold signal from the amplified signal, and wherein the second comparator stage is configured to amplify a differential output signal of the first comparator stage indicative of a result of the subtraction.

18. A method, comprising:
amplifying a signal in an automatic gain control (AGC) circuit including an amplifier and a peak detector, wherein the peak detector is direct-current (DC) coupled to an output of the amplifier, wherein the amplifier and the peak detector correspond to a path for an in-phase channel of the AGC circuit, and wherein the AGC circuit further includes a path for a quadrature channel; and using a first comparator stage and a second comparator stage of the peak detector to compare the amplified signal with a threshold signal.

19. The method of claim 18, further comprising:
applying, by a first digital-to-analog converter (DAC), a first offset compensation signal to an input of the amplifier; and
applying, by a second digital-to-analog converter (DAC), a second offset compensation signal to an input of an amplifier in the quadrature-channel path.

20. The method of claim 19, further comprising:
calculating a first rounding error indicative of a difference between the first offset compensation signal applied by the first DAC and an ideal offset compensation signal to reduce an offset of the in-phase channel path;
calculating a second rounding error indicative of a difference between the second offset compensation signal applied by the second DAC and an ideal offset compensation signal to reduce an offset of the quadrature channel path; and
adjusting one of the first and second offset compensation signals in response to the first and second rounding errors differing by more than a threshold.

21. The method of claim 18, wherein the using includes:
performing, at the first comparator stage, a subtraction of the threshold signal from the amplified signal; and
amplifying, at the second comparator stage, a differential output signal of the first comparator stage indicative of a result of the subtraction.

* * * * *